(12) United States Patent
Kihara et al.

(10) Patent No.: US 6,803,242 B2
(45) Date of Patent: Oct. 12, 2004

(54) EVALUATION METHOD OF IG EFFECTIVITY IN SEMICONDUCTOR SILICON SUBSTRATES

(75) Inventors: Takayuki Kihara, Tokyo (JP); Shinsuke Sadamitsu, Tokyo (JP); Koji Sueoka, Tokyo (JP)

(73) Assignee: Sumitomo Mitsubishi Silicon Corporation, Tokyo (JP)

(*) Notice: Subject to any disclaimer, the term of this patent is extended or adjusted under 35 U.S.C. 154(b) by 0 days.

(21) Appl. No.: 10/422,847

(22) Filed: Apr. 25, 2003

(65) Prior Publication Data

US 2003/0203519 A1 Oct. 30, 2003

(30) Foreign Application Priority Data

Apr. 25, 2002 (JP) ........................................ 2002-124027

(51) Int. Cl.[7] .............................................. H01L 21/66
(52) U.S. Cl. ............................ 438/14; 438/16; 438/17; 438/471; 438/476; 438/477
(58) Field of Search ............................. 438/14, 16, 17, 438/471, 476, 477

(56) References Cited

U.S. PATENT DOCUMENTS 6,129,787 A * 10/2000 Adachi et al. ................ 117/89
6,277,193 B1 * 8/2001 Sadamitsu et al. ............ 117/88
6,599,816 B2 * 7/2003 Sueoka et al. ............... 438/471
6,607,927 B2 * 8/2003 Ramappa et al. ............. 438/14
6,641,888 B2 * 11/2003 Asayama et al. .......... 428/64.1

FOREIGN PATENT DOCUMENTS

JP          11-147789         6/1999
JP          2000-068280       3/2000

OTHER PUBLICATIONS

Sadamitsu et al. (JP 2000–068280), Mar. 2000, (Translation).*

* cited by examiner

*Primary Examiner*—Maria Guerrero
(74) *Attorney, Agent, or Firm*—Wenderoth, Lind & Ponack, L.L.P.

(57) ABSTRACT

In a conventional evaluation method of IG effectivity on Cu in semiconductor silicon substrates, it is required to actually conduct the device process, or a great deal of time, manpower and expenses for manufacturing a MOS device for dielectric breakdown estimation and the like are needed, but in the present invention, the problem was solved by experimentally finding in advance the optimum ranges of the diagonal length and density of oxygen precipitates which make the IG effectivity on Cu favorable, and conducting a heat treatment for the addition of IG effectivity based on a simulation by calculations using Fokker-Planck equations so that the diagonal length and density of plate-like precipitates fall within the optimum ranges.

2 Claims, 3 Drawing Sheets

EVALUATION METHOD OF IG EFFECTIVITY IN SEMICONDUCTOR SILICON SUBSTRATES

BACKGROUND OF THE INVENTION

1. Field of the Invention

The present invention relates to an evaluation method of IG effectivity in semiconductor silicon substrates and, more particularly, to an evaluation method of IG effectivity on Cu in semiconductor silicon substrates used as substrates for semiconductor devices of various kinds.

2. Description of the Relevant Art

In a ULSI device manufacturing operation, a variety of heat treatments are conducted in various kinds of process steps according to the construction of the device. The presence of contamination with heavy metals, typically Fe, Ni and Cu in these steps of heat treatment causes the formation of defects or electrical levels in proximity to the surface of the semiconductor silicon substrate, resulting in degradation of device characteristics. Therefore, it is necessary to remove such heavy metals in the vicinity of the semiconductor silicon substrate surface which is a region for forming the device before going to the device manufacturing operation. As gettering methods of the heavy metals, IG (Intrinsic Gettering), EG (Extrinsic Gettering) of various kinds and the like are adopted.

It has been long known that the IG effectivity in the semiconductor silicon substrate has a correlation with the amount of oxygen precipitates. Hitherto, the IG effectivity in the semiconductor silicon substrate has been evaluated by measuring the density of oxygen precipitates after selective etching, or measuring the amount of oxygen precipitation from the difference in the amount of infrared absorption ($\Delta[Oi]$) before and after heat treatment, or the like.

However, the recent device process has been shifting from a conventional high-temperature process to a low-temperature process. Since the growth of oxygen precipitates is retarded in the low-temperature process, it has been difficult to obtain oxygen precipitates of large size sufficient to be observed by a conventional observation technique of oxygen precipitates in high density in the recent device process.

Therefore, the IG effectivity estimated by a conventional observation technique of oxygen precipitates such as a method wherein oxygen precipitates are observed using an optical microscope after selective etching to measure the density of oxygen precipitates (defects), or a method wherein the amount of oxygen precipitates is measured from the difference in the amount of infrared absorption ($\Delta[Oi]$) before and after heat treatment, does not have a strong correlation with an actual IG effectivity in the case of a semiconductor silicon substrate which passed the low-temperature process.

As a reason for this, the following is presumed: in the low-temperature process, a large number of minute oxygen precipitates (defects) which are difficult to detect by a conventional observation using an optical microscope after selective etching or an observation using a transmission electron microscope (TEM) are generated, and these minute defects contribute to the actual IG effectivity; and the difference in the amount of infrared absorption ($\Delta[Oi]$) in this case is a much smaller value than a value found in a semiconductor silicon substrate which passed a conventional high-temperature process.

With the above current state, as to a semiconductor silicon substrate which passed a low-temperature process, there is no appropriate evaluation index of an actual IG effectivity at present. In order to evaluate the IG effectivity, there are only two methods: (1) by actually putting a semiconductor silicon substrate to the device process, the influence on the device yield is examined; and (2) by measuring the electrical characteristics such as dielectric breakdown, the IG effectivity is evaluated.

However, in these methods (1) and (2), it is required to put a semiconductor silicon substrate to an actual device process, or a great deal of time, manpower and expenses for manufacturing a MOS device for dielectric breakdown estimation and the like are needed. Therefore, the development of a method whereby an actual IG effectivity can be evaluated at a low cost in a short time has been challenged.

In order to solve the above problem, the present applicants proposed a method for evaluating IG effectivity by whether the relationship $L \times D^{0.6} \geq 1.0 \times 10^7$ holds, where L (nm) is a diagonal length of oxygen precipitates and D (/cm$^3$) is a density thereof (Japanese Kokai No. 2000-68280).

In the recent device process, Cu has been used as an interconnection material, besides the adoption of a low-temperature process, so that the evaluation index of IG effectivity on Cu contamination resulting from minute oxygen precipitates formed in the low-temperature process has been demanded. The above evaluation method is effective on contamination with Ni or Fe, but in evaluating the IG effectivity on Cu contamination which has recently received attention, there are cases where the IG effectivity on Cu is not actually favorable even if the above relationship is satisfied, or cases where the IG effectivity on Cu is actually favorable even if the above relationship is not satisfied. It is found that the above method is insufficient to evaluate the IG effectivity on Cu with high accuracy.

SUMMARY OF THE INVENTION

In order to solve the above problem, an evaluation method of IG effectivity in semiconductor silicon substrates (1) according to the present invention is characterized by experimentally obtaining the optimum ranges of the diagonal length and density of oxygen precipitates which make the IG effectivity on Cu favorable in advance, and evaluating the IG effectivity on Cu by whether the diagonal length and density of oxygen precipitates fall within the optimum ranges.

Using the above evaluation method of IG effectivity in semiconductor silicon substrates (1), it is possible to find the diagonal length and density of the precipitates from a computer simulation. Therefore, it is unnecessary to put a semiconductor silicon substrate to an actual device process, and also unnecessary to manufacture a MOS device for dielectric breakdown estimation, so that it becomes possible to accurately evaluate an actual IG effectivity on Cu at a low cost in a short time.

An evaluation method of IG effectivity in semiconductor silicon substrates (2) according to the present invention is characterized by the optimum ranges, being ranges in which L becomes larger than 300 nm when a value of D is smaller than $1 \times 10^9$/cm$^3$, and L becomes larger than 200 nm when a value of D is not less than $1 \times 10^9$/cm$^3$, where L (nm) is a diagonal length of the oxygen precipitates and D (/cm$^3$) is a density thereof in the above evaluation method of IG effectivity in semiconductor silicon substrates (1).

Using the above evaluation method of IG effectivity in semiconductor silicon substrates (2), it becomes possible to very accurately evaluate the IG effectivity on Cu with the range which satisfies the above optimum ranges as the control index.

An evaluation method of IG effectivity in semiconductor silicon substrates (3) according to the present invention is characterized by obtaining the diagonal length and density of the oxygen precipitates from a computer simulation using Fokker-Planck equations with heat treatment conditions input, and then evaluating the IG effectivity on Cu by whether the diagonal length and density fall within the optimum ranges thereof in the above evaluation method of IG effectivity in semiconductor silicon substrates (1) or (2).

Using the above evaluation method of IG effectivity in semiconductor silicon substrates (3), the diagonal length L (nm) and density D (/cm$^3$) of the oxygen precipitates can be obtained with accuracy through a computer simulation, and it is possible to accurately evaluate an actual IG effectivity on Cu in an extremely short time.

DESCRIPTION OF THE PREFERRED EMBODIMENTS

Figure 1:
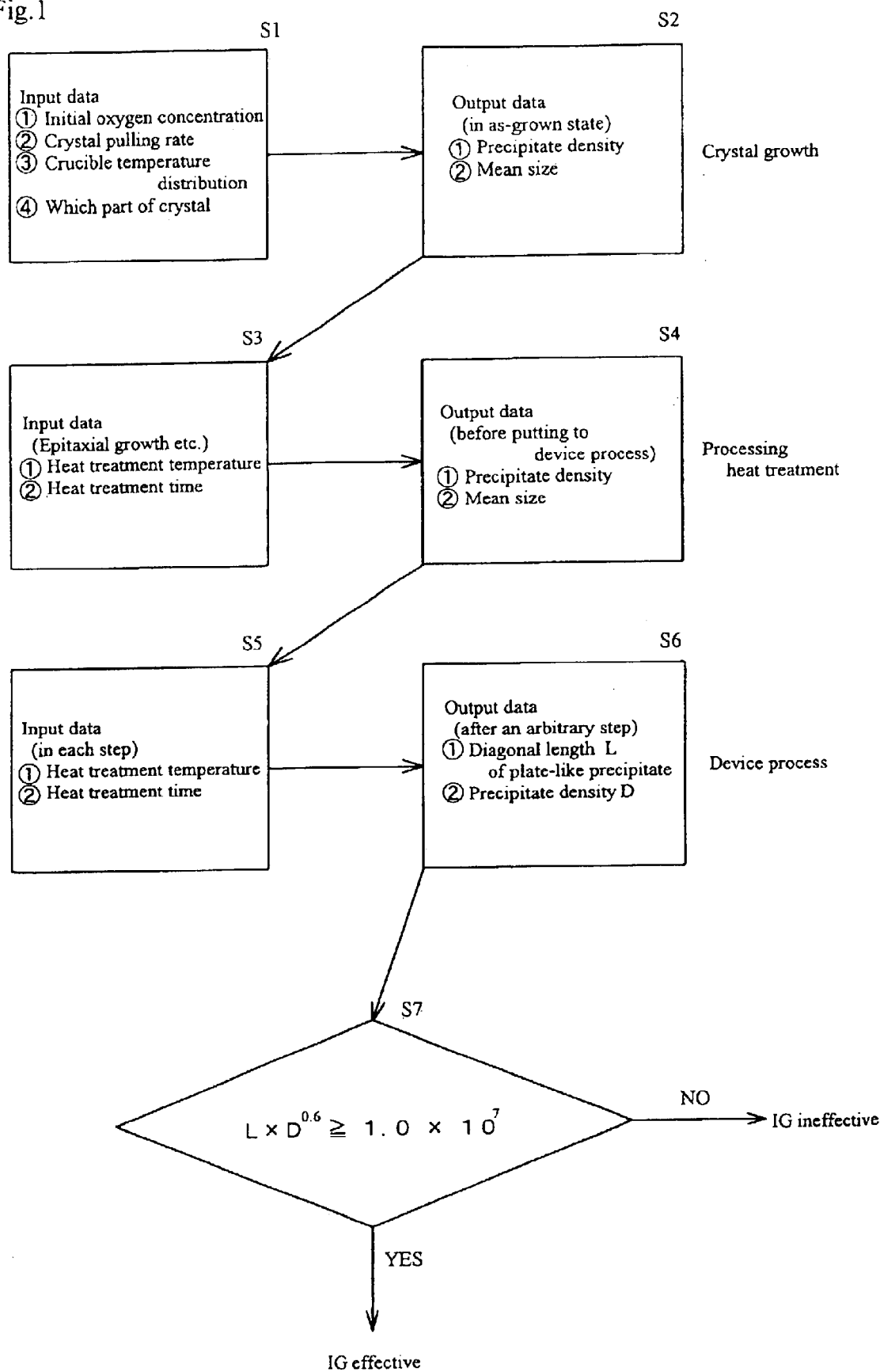
FIG. 1 is a flow chart showing an algorithm of IG effectivity evaluation in a semiconductor silicon substrate according to an embodiment of the present invention.

The preferred embodiments of an evaluation method of IG effectivity in semiconductor silicon substrates according to the present invention are described below. In the evaluation method of IG effectivity on Cu found by the present inventors, wherein minute oxygen precipitates which could not be observed before are taken into consideration, heat treatment conditions and size distribution of oxygen precipitates are calculated through a computer simulation using Fokker-Planck equations, the details of which are described below, (M. Schrems et al., Semiconductor Silicon 1990, p144), and the size distribution of oxygen precipitates is used as a control index of IG effectivity on Cu.

In order to experimentally find the heat treatment conditions for obtaining a semiconductor silicon substrate having IG effectivity on Cu, heat treatment is conducted on sample semiconductor silicon substrates having prescribed characteristics such as a specific resistance ρ and an oxygen concentration [Oi] at various temperatures for various periods of time, so as to form plate-like oxygen precipitates having different diagonal lengths and densities.

Then, the surfaces of these sample semiconductor silicon substrates are contaminated with Cu at a concentration of $1 \times 10^{12}$/cm$^2$, and a heat treatment at 950° C. for 10 minutes is conducted thereon so as to diffuse Cu into the substrates. These sample semiconductor silicon substrates are kept at room temperature for 10 days, and then the Cu concentrations on the substrate surfaces are measured by atomic absorption spectrometry.

At this time, if the IG effectivity on Cu is sufficient within a semiconductor silicon substrate, the Cu concentration of the semiconductor silicon substrate surface decreases to the $1 \times 10^{10}$/cm$^2$ range, not more than one tenth of the amount of contamination. Therefore, when the Cu concentration of the substrate surface is not more than $1 \times 10^{11}$/cm$^2$, it can be judged that the IG effectivity on Cu is favorable.

The diagonal lengths and densities of oxygen precipitates at various temperatures for various heat treatment periods of time are obtained through computer simulations.

The present inventors got a knowledge through the results of the above experiments and simulations using a computer that the ranges, wherein L becomes larger than 300 nm when a value of D is smaller than $1 \times 10^9$/cm$^3$, and L becomes larger than 200 nm when a value of D is not less than $1 \times 10^9$/cm$^3$, where L (nm) is a diagonal length of the plate oxygen precipitates and D (/cm$^3$) is a density, are the optimum ranges of the diagonal length and density of oxygen precipitates which make the IG effectivity on Cu favorable, and found that when heat treatment is conducted so that the optimum ranges are satisfied, the actual IG effectivity on Cu of the obtained semiconductor silicon substrate is favorable.

The simulation with a computer used in the present embodiment was developed by Schrems et al. (M. Schrems et al., Semiconductor Silicon 1990, p144), and the outline thereof is described below.

The oxygen precipitation behavior in a silicon single crystal is expressed using a size distribution function f (r, t), a function of the oxygen precipitate radius r and heat treatment time t, and the change of f (r, t) with time is obtained by resolving the following Fokker-Planck equations.

[Equation 1]

$$\frac{\partial}{\partial t} f(r,t) = -\frac{\partial}{\partial r} J(r,t) \qquad \text{[Equation 1]}$$

[Equation 2]

$$J = -B(r,t)\frac{\partial f}{\partial r} + A(r,t)f \qquad \text{[Equation 2]}$$

Here, A (r, t) and B (r, t) in Equation 2 satisfy the following relationship.

[Equation 3]

$$B(r,t) = \frac{-kT}{\partial \Delta G/\partial r} A(r,t)f \qquad \text{[Equation 3]}$$

In Equation 3, k is Boltzmann constant, T is an absolute temperature, and ΔG=ΔG (r, t) is a free energy variation of Gibbs associated with the formation of oxygen precipitates having a radius r.

And from f (r, t) after an arbitrary heat treatment, the density D (/cm$^3$) of the oxygen precipitates and the diagonal length L (nm) of the plate-like oxygen precipitates are calculated using the following equations.

[Equation 4]

$$D(/\text{cm}^3) = \int f(r,t)dr \qquad \text{[Equation 4]}$$

[Equation 5]

$$L(\text{nm}) = 10^7 \times \left[\frac{8}{\beta}\right]^{\frac{1}{3}} \frac{rf(r,t)dr}{D(/\text{cm}^3)}$$  [Equation 5]

Here, s is an aspect ratio of the plate-like oxygen precipitates (thickness/diagonal length of the plate-like oxygen precipitates), which is about 0.01.

The evaluation algorithm of IG effectivity in a semiconductor silicon substrate according to the embodiment is described below by reference to a flow chart shown in FIG. 1. The behavior of oxygen precipitates during crystal growth is calculated. In Step 1, as input data, ① the initial oxygen concentration, ② the crystal pulling rate, ③ the crucible temperature distribution and ④ which part of a crystal it is, are given. Then, in Step 2, ① the oxygen precipitate density and ② the mean size of oxygen precipitates after growth (or in the as-grown state) can be obtained.

In Step 3, among the conditions of heat treatments usually conducted before the device process by semiconductor silicon substrate makers, ① the heat treatment temperature and ② the heat treatment time are given as input data. Here, donor killer processing, epitaxial growth processing in the case of an epitaxial semiconductor silicon substrate, DZ-IG processing and the like are included. As a result, in Step 4, ① the oxygen precipitate density and ② the mean size of oxygen precipitates after the heat treatment can be obtained.

In Step 5, ① the heat treatment temperature and ② the heat treatment time in each step of the device process are given as input data. As a result, in Step 6, ① the diagonal length L of plate-like oxygen precipitates and ② the density after an arbitrary step can be obtained as output data. Finally, in Step 7, whether the obtained semiconductor silicon substrate has IG effectivity or not is judged by whether the diagonal length and density are within the optimum ranges thereof Here, the present evaluation method of IG effectivity in semiconductor silicon substrates can be completed within about 15 minutes even using a personal computer, once the optimum ranges of the size and density of oxygen precipitates are obtained, and no experiments are required.

The present inventors examined actual experiments, and the relationship between the diagonal length L and density D computed from heat treatment conditions and the IG effectivity using this method, and found that there are optimum ranges of the diagonal length and density of oxygen precipitates specific to Cu, which make the IG effectivity as to Cu favorable. That is, they found that the IG effectivity on Cu is favorable in the ranges wherein L becomes larger than 300 nm when a value of D is smaller than $1 \times 10^9/\text{cm}^3$, and where L becomes larger than 200 nm when a value of D is not less than $1 \times 10^9/\text{cm}^3$, where L (nm) is a diagonal length of plate-like oxygen precipitates and D ($/\text{cm}^3$) is a density.

Using the method according to the present embodiment, once the optimum ranges of the size and density of oxygen precipitates having IG effectivity on Cu are found, changes in IG effectivity due to heat treatment can be predicted only by conducting a computer simulation without experiments. Consequently, it becomes possible to relatively easily optimize the heat treatment conditions for the addition of IG effectivity. Using the method according to the present embodiment, once the optimum ranges of the size and density of oxygen precipitates having IG effectivity on Cu are obtained, no experiments are required. Therefore, it is possible to substantially reduce semiconductor silicon substrates for test or evaluation manpower, so that it becomes possible to substantially reduce manufacturing cost of semiconductor silicon substrates having an excellent IG effectivity on Cu.

EXAMPLES

Sample semiconductor silicon substrates, having a diameter of 8 inches, being p-type (100) CZ-Si substrates, and having a specific resistance $\rho=4.5–6.0$ $\Omega\cdot\text{cm}$ and an oxygen concentration $[\text{Oi}]=14.0 \times 10^{17}$ atoms/$\text{cm}^3$ (old ASTM) were used. In order to vary the plate-like oxygen precipitate density in the substrates, heat treatment was conducted on the silicon substrates at various temperatures not more than 1000° C., and then, in order to vary the diagonal length of the plate-like oxygen precipitates, heat treatment was conducted thereon at 1000° C. for 1, 4, 8, or 16 hours. After contaminating each semiconductor silicon substrate surface with Cu at a concentration of $1 \times 10^{12}/\text{cm}^2$, Cu was diffused into the substrates by conducting a heat treatment at 950° C. for 10 minutes. Then, the semiconductor silicon substrates were kept at room temperature for 10 days and the Cu concentration on each substrate surface was measured by atomic absorption spectrometry.

Figure 2:
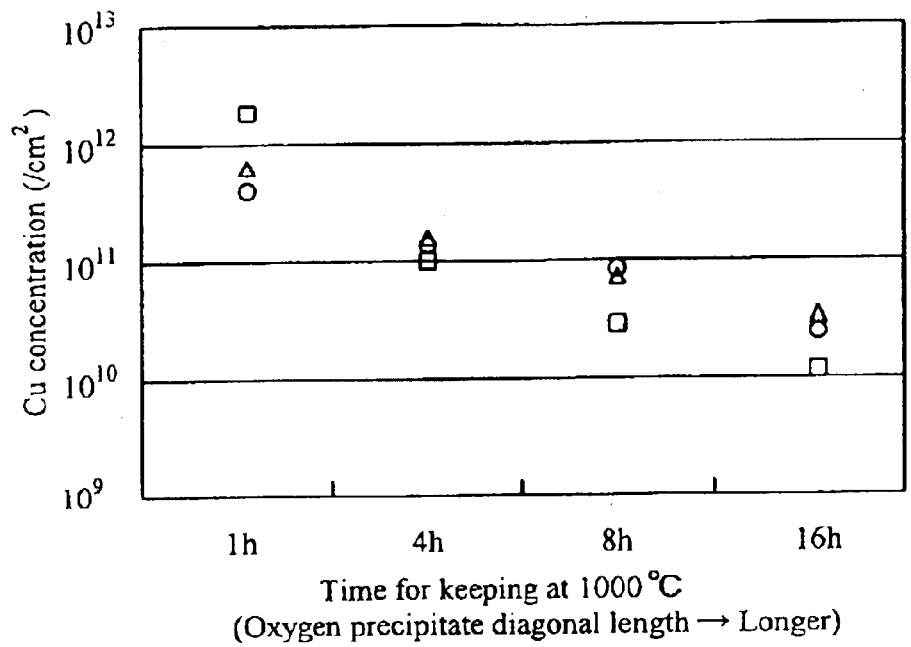
FIG. 2 is a graph showing Cu concentrations on the semiconductor silicon substrate surfaces according to an example.

In FIG. 2, the measurement results of Cu concentration on each semiconductor silicon substrate surface are shown. In the figure, ○, Δ and □ show the results in cases where the mean density of oxygen precipitates within the semiconductor silicon substrate is $5 \times 10^7/\text{cm}^3$, $2 \times 10^8/\text{cm}^3$ and $7 \times 10^9/\text{cm}^3$, respectively. As obvious from this figure, it is found that when the oxygen precipitate density is the same, the Cu concentration decreases as the keeping time increases (the size of oxygen precipitates becomes larger).

Figure 3:
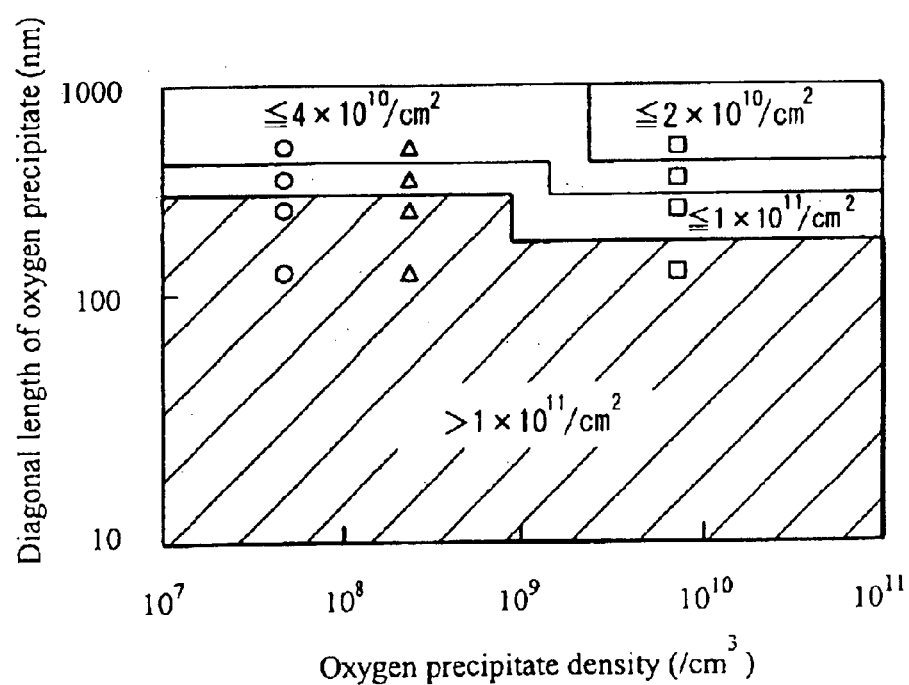
FIG. 3 is a graph showing the optimum range of IG effectivity on Cu according to the example.

The diagonal lengths and densities of the plate-like oxygen precipitates within the sample substrates were obtained through computer simulations using Fokker-Planck equations, and the results combined with the above measurement results of Cu concentration are shown in FIG. 3. In the figure, ○, Δ and □ show the mean densities of oxygen precipitates in the same cases as those in FIG. 2, respectively. The region hatched shows a region wherein the IG effectivity on Cu is not favorable (IG ineffective), while the region not hatched shows a region wherein the IG effectivity on Cu is favorable (IG effective). Generally speaking, it can be judged that the IG effectivity is favorable when the Cu concentration is lower than $1 \times 10^{11}/\text{cm}^2$ from the relationship with the device yield.

From the above results, as shown in FIG. 3, it could be determined that the relationship between the diagonal length L (nm) and density D ($/\text{cm}^3$) of oxygen precipitates which make the IG effectivity on Cu favorable is L>300 nm in the case of D<$1 \times 10^9/\text{cm}^3$, and L>200 nm in the case of D$\geq 1 \times 10^9/\text{cm}^3$.

Three kinds of substrates, a p/p-epitaxial semiconductor silicon substrate, a p/p-epitaxial semiconductor silicon substrate to which nitrogen of $1 \times 10^{13}/\text{cm}^3$ or more was doped, and a semiconductor silicon substrate on which IG (two stepped heat treatment at 800° C.+1000° C.) processing was conducted, were prepared. A standard device high-temperature heat treatment was conducted on each substrate. And then, the diagonal length and density of plate-like oxygen precipitates within each substrate were obtained through computer simulations using Fokker-Planck equations, and the IG effectivity on Cu in each substrate was evaluated using the control index of the optimum range of IG effectivity on Cu determined as shown in FIG. 3. The evaluation results are shown in FIG. 4.

Figure 4:
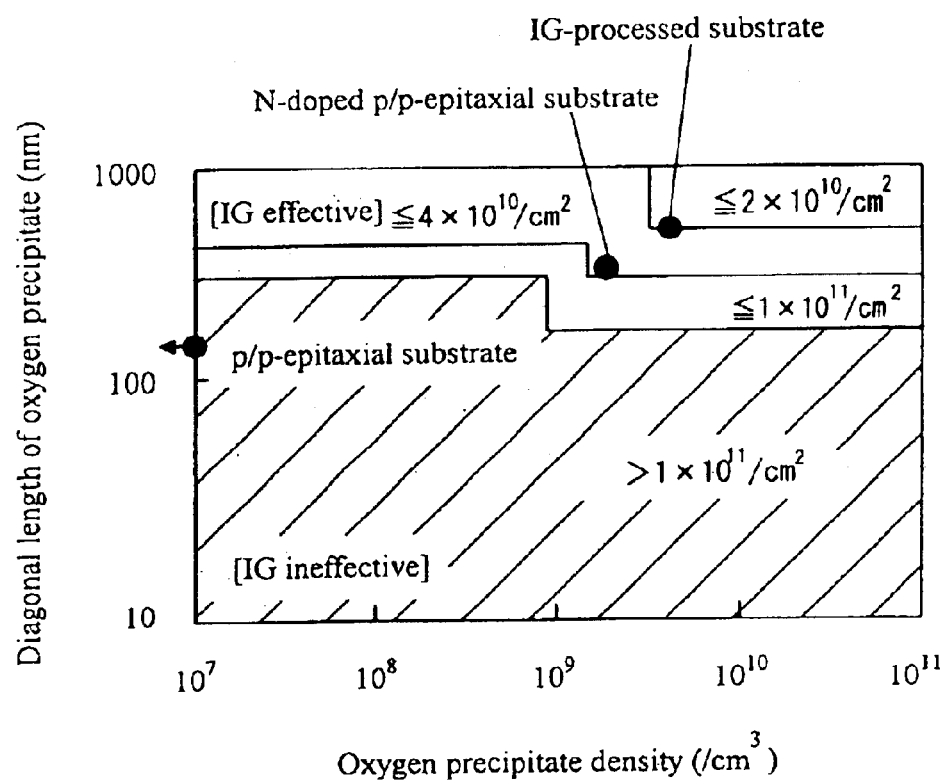
FIG. 4 is a graph showing the results of IG effectivity on Cu predicted by the evaluation method of IG effectivity according to the present invention as to various kinds of semiconductor silicon substrates according to the example.

As obvious from FIG. 4, both in the case of the N-doped p/p-epitaxial semiconductor silicon substrate and in the case of the IG-processed semiconductor silicon substrate, favorable IG effectivity on Cu was predicted. This prediction is successfully related to the yield in the actual device process, which made clear that the present evaluation method has a high precision.

Here, in the evaluation method of IG effectivity on Cu in semiconductor silicon substrates according to the above example, it is unnecessary to prepare a MOS device for dielectric breakdown estimation. Therefore, it can be conducted in a much shorter time than a conventional evaluation method wherein electrical characteristics such as dielectric breakdown are measured for evaluation. And once the optimum ranges of the size and density of oxygen precipitates having IG effectivity are obtained, no experiments are needed in the following evaluation. As a result, expenses of semiconductor silicon substrates for test and the like are not required, leading to a substantial reduction in cost required for IG effectivity evaluation.

By applying the present evaluation method, it is possible to predict whether the IG effectivity on Cu is possessed or not before going to the device process, so that it becomes easy to manufacture semiconductor silicon substrates having an excellent IG effectivity. And since it is possible to predict whether the IG effectivity is possessed or not before going to the device process, it becomes possible to manufacture devices with higher yield.

Furthermore, the present evaluation method can be also applied to low-resistance semiconductor silicon substrates such as P+, P++, N+ and N++, which cannot be evaluated because of their strong infrared absorption by a conventional evaluation method wherein the difference $\Delta[Oi]$ in the amount of infrared absorption is measured by measuring infrared absorption, so that it also becomes possible to easily predict IG effectivity regarding these low-resistance semiconductor silicon substrates.

What is claimed is:

1. An evaluation method of IG effectivity in semiconductor silicon substrates, comprising experimentally obtaining the optimum ranges of the diagonal length and density of oxygen precipitates which make the gettering (IG) effectivity on Cu favorable in advance, and evaluating the IG effectivity on Cu by whether the diagonal length and density of oxygen precipitates fall within the optimum ranges, wherein the optimum ranges are ranges in which L becomes larger than 300 nm when a value of D is smaller than $1 \times 10^9/cm^3$, and L becomes larger than 200 nm when a value of D is not less than $1 \times 10^9/cm^3$, where L (nm) is a diagonal length of the oxygen precipitates and D ($/cm^3$) is a density of the oxygen precipitates.

2. An evaluation method of IG effectivity in semiconductor silicon substrates according to claim 1, wherein the diagonal length and density of the oxygen precipitates are obtained from a computer simulation using Fokker-Planck equations with heat treatment conditions input, and then the IG effectivity on Cu is evaluated by whether the diagonal length and density of the oxygen precipitates fall within the optimum ranges.

* * * * *